(12) United States Patent
Matus et al.

(10) Patent No.: US 7,652,384 B2
(45) Date of Patent: Jan. 26, 2010

(54) FABRICATING TALL MICRO STRUCTURES

(75) Inventors: Gabriel Matus, Santa Clara, CA (US); Vlad Novotny, Los Gatos, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 283 days.

(21) Appl. No.: 11/680,600

(22) Filed: Feb. 28, 2007

(65) Prior Publication Data

US 2008/0220270 A1  Sep. 11, 2008

(51) Int. Cl.
*H01L 23/29* (2006.01)

(52) U.S. Cl. .................. 257/790; 257/794; 257/100; 257/433; 257/E23.123; 257/E23.193; 438/124; 438/126; 438/127

(58) Field of Classification Search .......... 257/790, 257/794, 100, 433, E23.123, E23.193; 438/124, 438/126, 127
See application file for complete search history.

(56) References Cited

U.S. PATENT DOCUMENTS

| 2001/0038428 A1* | 11/2001 | Lee et al. ............... 349/113 |
| 2002/0080311 A1* | 6/2002 | Tanada et al. ........... 349/117 |
| 2006/0063371 A1* | 3/2006 | Lin et al. ............... 438/618 |

* cited by examiner

*Primary Examiner*—Tu-Tu V Ho
(74) *Attorney, Agent, or Firm*—Fish & Richardson P.C.

(57) ABSTRACT

A micro structure includes a seed electrode layer on a substrate and a plurality of conductive layers on the seed electrode layer. The combined thickness of the seed electrode layer and the plurality of conductive layers can be more than 0.1 mm and the lateral dimensions of the seed electrode layer and the plurality of conductive layers vary less than 20% along the direction normal to a surface of the substrate and the micro structure has striations on an outer surface.

20 Claims, 14 Drawing Sheets

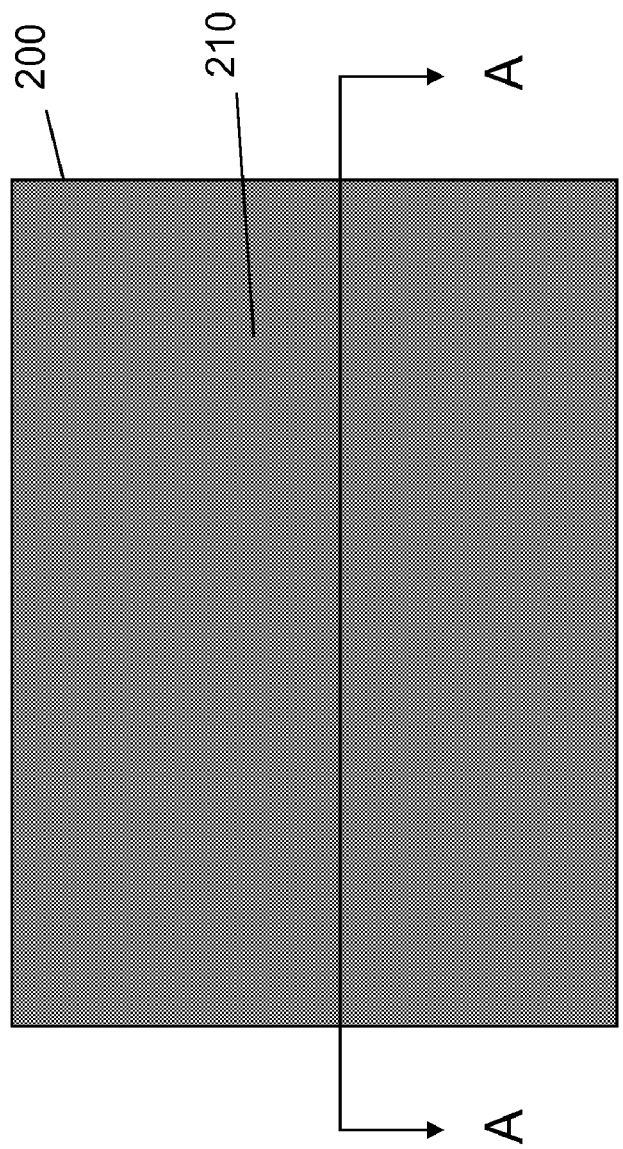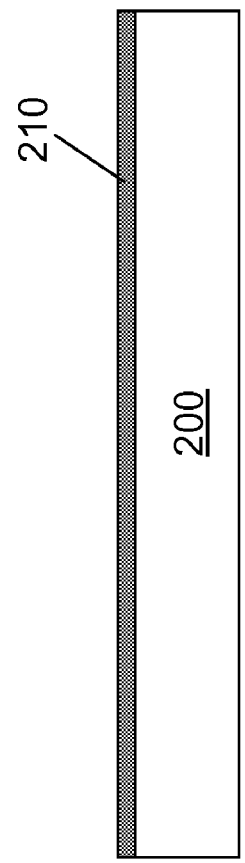
Figure 2A
Figure 2B

FABRICATING TALL MICRO STRUCTURES

BACKGROUND

The present disclosure relates to fabricating microstructures on a substrate.

Many micro devices include micro structures which are required to have predefined lateral dimensions and heights with specific aspect ratios. For example, a micro mechanical device on a substrate may have a structure portion that protrudes over the substrate. The height of the structure portion over the substrate may vary from several microns to several millimeters. Packaging the micro mechanical device on the substrate may include fabricating a wall structure and a cover. The wall structure can be connected to the substrate and surround the micro mechanical device. The cover is connected to the top surface of the wall structure. The wall structure and the cover can form a chamber on the substrate. To encapsulate the micro mechanical device in the chamber, the wall structure needs to be higher than the micro mechanical device on the substrate. The wall structure may be required to be as high as several hundred microns to several millimeters. The wall structure is often required to be separated from the micro mechanical device by a well defined distance within the chamber to ensure the proper operation of the micro mechanical device and to minimize the footprint of the micro mechanical device and the chamber on the substrate. The lateral dimensions of the wall structure thus often need to be minimized and controlled within a small tolerance.

SUMMARY

In one general aspect, a micro structure is described that includes a seed electrode layer on a substrate and a plurality of conductive layers on the seed electrode layer. The combined thickness of the seed electrode layer and the plurality of conductive layers is more than 0.1 mm, the lateral dimensions of the seed electrode layer and the plurality of conductive layers vary less than 20% along the direction normal to a surface of the substrate and the micro structure has striations on an outer surface.

In another general aspect, a micromechanical system is described that includes a substrate, a micro device on the substrate and an encapsulation device bonded with the surface of the substrate to form a chamber in which the micro device is encapsulated. The encapsulation device includes a micro structure that includes a seed electrode layer on a substrate and a plurality of conductive layers on the seed electrode layer. The combined thickness of the seed electrode layer and the plurality of conductive layers is more than 0.1 mm or 0.5 mm and the lateral dimensions of the seed electrode layer and the plurality of conductive layers vary less than 20% or 10% along the direction normal to a surface of the substrate. The micro structure has striations on an outer surface.

In another general aspect, a method for building a micro structure on a substrate is described. The method includes forming a first layer of conductive material on a first portion of an upper side of the substrate, applying a first layer of photo-patternable material on the first layer of conductive material and a second portion of the substrate that is not covered by the first layer of conductive material and irradiating the first layer of photo-patternable material with photons from the underside of the substrate. The substrate is at least partially transparent to photons and the first layer of conductive material is substantially opaque to the photons. A portion of the first layer of photo-patternable material is removed from on the first layer of conductive material to form a first mask layer on the substrate. The portion corresponds to the photo-patternable material on the first layer of conductive material. The first mask layer has a first opening that exposes the first layer of conductive material. A second layer of conductive material is formed on the first layer of the conductive material.

Implementations of the systems and methods described herein may include one or more of the following features. The methods can further include applying a second layer of photo-patternable material on the second layer of conductive material and the first mask layer, irradiating the second layer of photo-patternable material from the underside of the substrate, removing the second layer of photo-patternable material on the second layer of the conductive material to form a second mask layer on the first mask layer, wherein the second mask layer has a second opening substantially aligned with the first opening in the first mask layer, and forming a third layer of conductive material on the second layer of conductive material. The first layer of conductive material and the second layer of conductive material can be compositionally identical. The first layer of conductive material or the second layer of conductive material can include a metallic material. The metallic material can include copper, nickel, gold, tin, silver, palladium, platinum, rhodium, indium, ruthenium, zinc, antimony, tantalum, chromium, a combination thereof or an alloy including at least one of the metals. The first layer of photo-patternable material on the second portion of the substrate can be hardened by irradiating and the first layer of photo-patternable material on the first layer of conductive material can be substantially unchanged by the step of irradiating. The substrate can include an oxide, such as glass, silicon oxide, sapphire, or quartz, a plastic material, or diamond. The photo-patternable material can include an epoxy or a photo resist. Forming a first layer of conductive material on a first portion of an upper side of the substrate can include forming a seed electrode layer on the upper side of the substrate, forming a seed-layer mask on the seed electrode layer to expose a portion of the seed electrode, forming the first layer of conductive material on the exposed portion of the seed electrode and removing the seed-layer mask before applying a first layer of photo-patternable material to form the first layer of conductive material on the first portion of the upper side of the substrate. The method can further include removing the mask before applying the first layer of photo-patternable material on the first layer of conductive material. Forming a first layer of conductive material on the exposed portion of the seed electrode can include exposing the seed electrode layer to an electrolytic solution and applying an electric current to the electrolytic solution through the seed electrode layer to form the first layer of conductive material on the substrate. The electrolytic solution can include metallic ions that are reducible to metal atoms, which form the first layer of conductive material. The seed electrode layer and the first layer of conductive material can be compositionally identical. Irradiating the first layer of photo-patternable material can include exposing the first layer of photo-patternable material to UV light, visible light, or x-ray. Removing the first layer of photo-patternable material from the first layer of conductive material can leave a mask with an opening over the first layer of conductive material. Forming a second layer of conductive material can include exposing the first layer of conductive material to an electrolytic solution and applying an electric current to the electrolytic solution through the first layer of conductive material to form the second layer of conductive material on the first layer of conductive material.

Various implementations of the methods and devices described herein may include one or more of the following advantages. The disclosed systems and methods can overcome the height and aspect ratio limitations of micro structures formed by some conventional fabrication processes. The disclosure provides systems and methods for building a micro structure as high as 0.1 mm, 0.5 mm, 1 mm, or even higher, and with well defined lateral dimensions and wall angles, thus overcoming limitations associated with conventional micro fabrication techniques. The disclosed systems and methods can also achieve a height-to-width ratio between 1:1 and 100:1. The thickness limit for some conventional processes based on photo resist masking is approximately 100 microns. It can be difficult for the conventional processes to achieve a high height-to-width ratio, such as between 1:1 and 100:1.

The disclosed systems and methods can also avoid creating variations in the micro structure's lateral dimensions by forming the micro structures in multiple steps. Some fabrication methods use photo resist to define the side walls of the micro structures. Electroplating baths used to form some micro structures are acidic and can attack the photo resist. Eroding the photo resist can widen the opening in the photo resist during electroplating, that is, the width of the top of the micro structure may be greater than the width of the bottom of the micro structure. Variation in the lateral dimensions of the micro structure can increase as the electroplating thickness increases.

This disclosure provides simple and efficient approaches for building a micro structure. An opaque structure built on a substrate can be used as a photo mask to define the lateral dimensions of the additional upper structure to be formed on the opaque structure. The use of the lower opaque structure to define the upper structure allows the lateral dimensions of the micro structure to be maintained within tolerance along the height dimension of the micro structure. The use of the opaque structure as a photo mask can eliminate the need for forming photo mask on the substrate.

The height of the micro structure in the disclosed methods can be easily increased by repeating the steps of photo mask patterning and electroplating additional conductive layer on the already formed micro structure. The structure growth in each step can be selected to be lower than a thickness limitation such that the lateral dimensions of the structure are kept within tolerance through the different steps. Furthermore, the disclosed methods are suitable for fabricating a micro structure on a transparent or semi-transparent substrate.

Although the invention will be particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles, devices and methods described herein.

DETAILED DESCRIPTION

Figure 1:
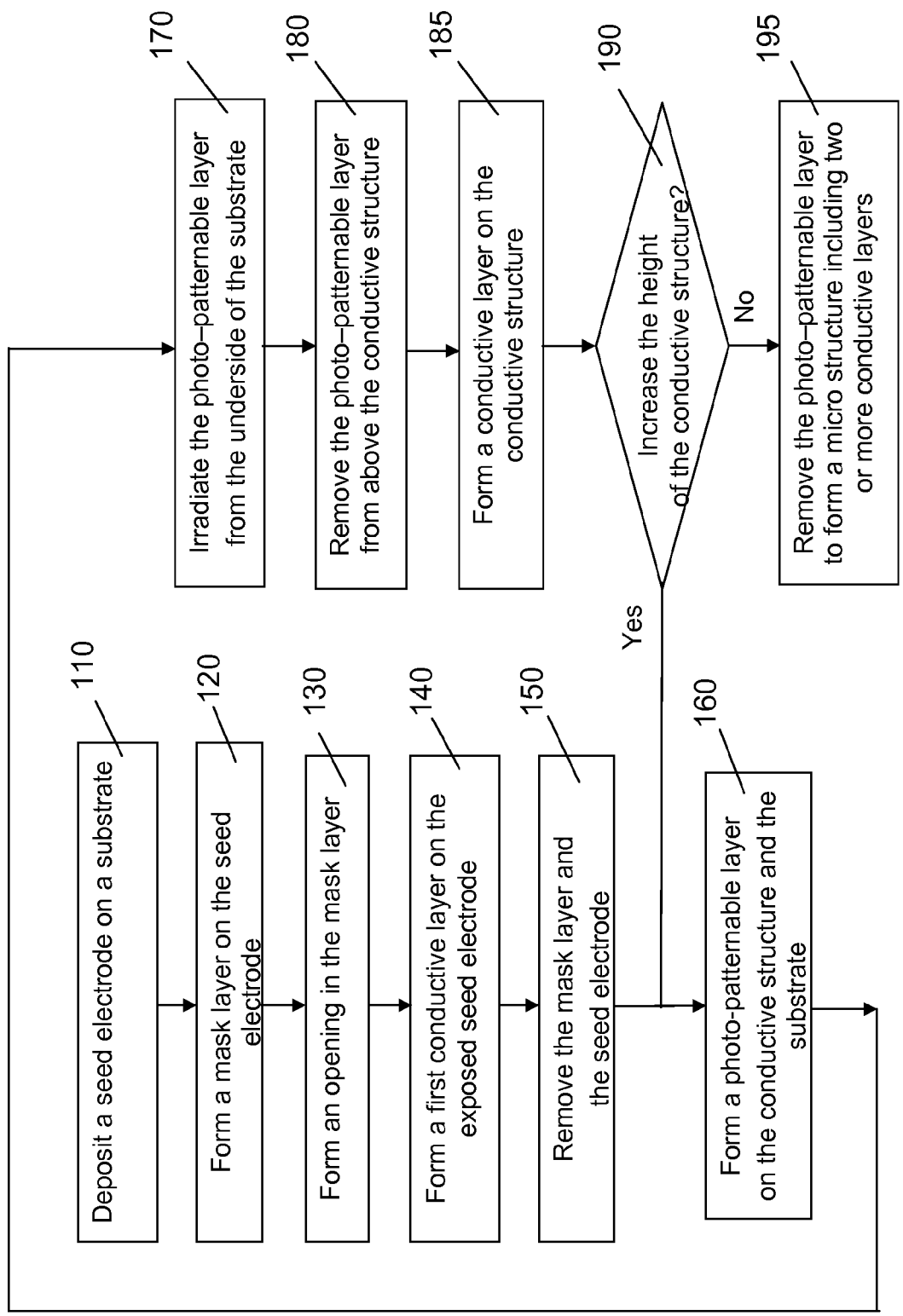
FIG. 1 is a flow diagram for building a tall micro structure on a substrate.

Referring to FIGS. 1, 2A, and 2B, a seed electrode 210 is deposited on a substrate 200 (step 110). The seed electrode 210 is conductive and can be made of a metallic material such as copper, nickel, gold, tin, silver, palladium, platinum, rhodium, indium, chromium, ruthenium, zinc, antimony, tantalum, or an alloy including one or more of the previously named metals. The layer of seed electrode 210 can have a thickness of one to a few thousand angstroms. For example, the layer of seed electrode 210 can be about 1000 to 2000 angstroms in thickness. Forming the layer of seed electrode 210 can include depositing a single layer or multiple layers of one or more conductive materials by sputtering, evaporation or bonding. For example, forming the layer of seed electrode 210 can include an initial formation of a thin film of chromium, titanium or tantalum as an adhesion layer and subsequently depositing a thicker film of nickel or copper.

Figure 2C:
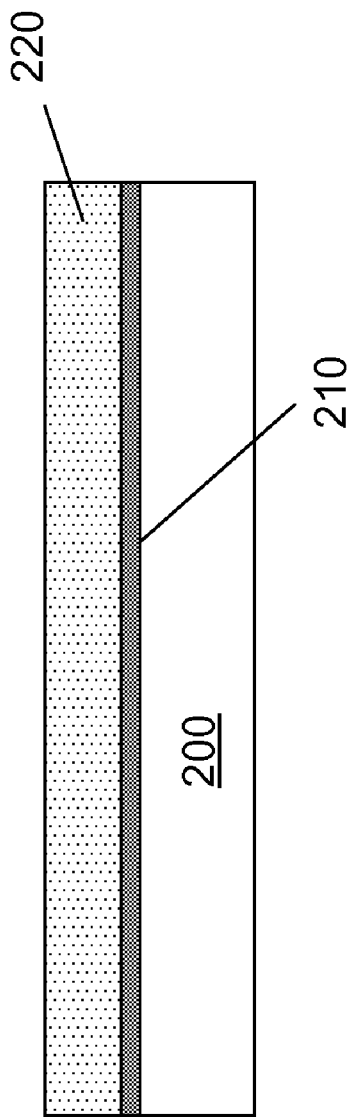
FIGS. 2A-2O are cross-sectional views at different steps of the micro structure fabrication.
Figure 2D:
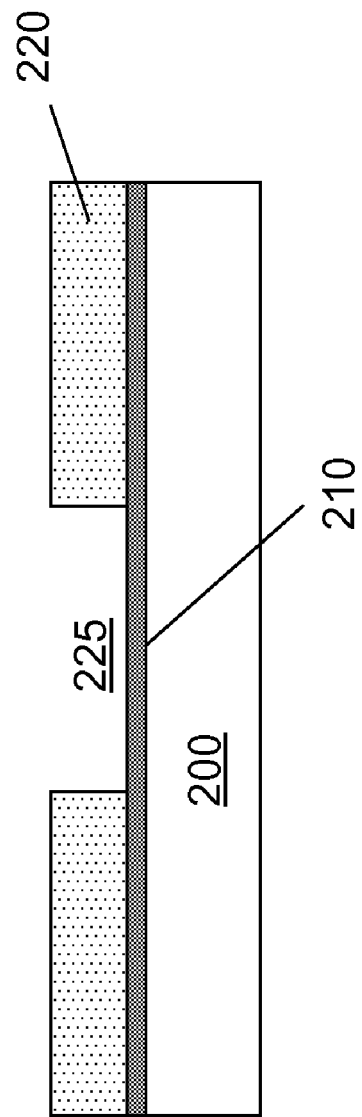

A mask layer 220 is then formed on the seed electrode 210 (step 120 and FIG. 2C). A portion of the mask layer 220 is then removed to form an opening 225 that exposes some of the seed electrode 210 (step 130 and FIG. 2D). The mask layer 220 can be made of a photo-patternable material, such as a photo resist. The opening 225 can be formed using standard photolithography on the upper surface of the mask layer 220, removing a portion of the mask layer to form the opening 225, and subsequently removing the photo-patternable material.

Figure 2E:
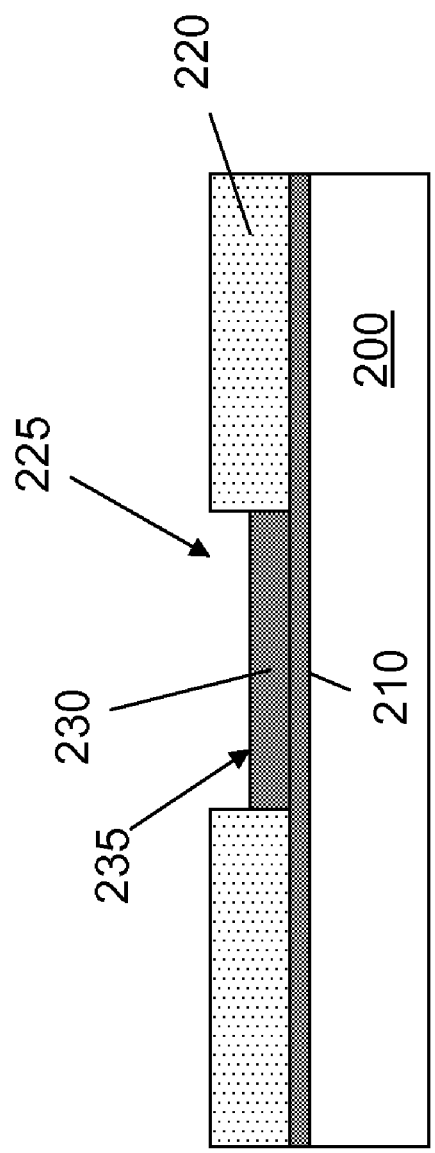

A conductive layer 230 is then formed on the exposed seed electrode layer (step 140 and FIG. 2E). The portion of the seed electrode 210 in the opening 225 is exposed to an electrolytic solution that contains metallic ions. The seed electrode 210 is connected to a current source, voltage source, or power supply, such as at an edge of the electrode 210. An electric current is them applied to the electrolytic solution through the seed electrode 210. The metal ions in the electrolytic solution are reduced to form a conductive layer 230 on the substrate 200. The conductive layer 230 can be one to a few hundred microns in thickness.

In some embodiments, the conductive layer 230 can be made of the same conductive material as the seed electrode 210. For example, the conductive layer 230 can include copper, nickel, gold, tin, silver, palladium, platinum, rhodium, ruthenium, zinc, antimony, indium, or an alloy including one or more of the previously mentioned metals. Particularly conductive materials, such as nickel, can be selected because they may produce lower stress in the conductive layer 230 and can prevent cracking and delamination. The conductive layer 230 and the seed electrode 210 underneath the conductive layer 230 can form a unitary conductive structure, which is the primary conductive structure 235 on the substrate 200. The conductive layer 230 and the seed electrode 210 can have different or the substantially the same material compositions.

Figure 2F:
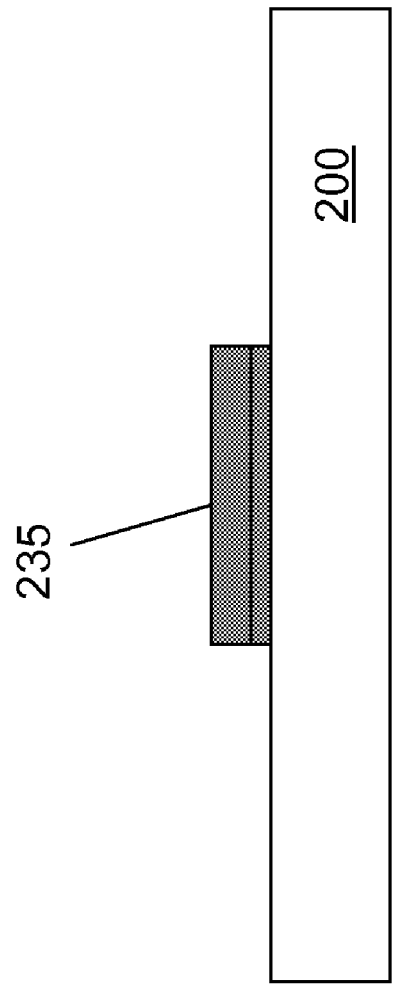

The mask layer 220 and the seed electrode 210 not covered by the conductive layer 230 are next removed to leave the primary conductive structure 235 on the substrate 200 (step 150 and FIG. 2F). The mask layer 220 can be removed by a wet process involving, for example, an acidic solution, or a dry process, such as plasma etching or UV/ozone etching. The portion of the seed electrode 210 not covered by the conductive layer 230 can be removed by a wet process involving, for example, an acidic solution or a corrosive solution or by a dry etch process. Some material in the conductive layer 230 may also be removed during the removal process for the seed electrode 210. But since the conductive layer 230 (normally one to a few hundred microns in thickness) is much thicker than the seed electrode 210 (normally one to a few thousand angstroms in thickness), the loss of material in the conductive layer 230 is proportionally small relative to the height of the conductive layer 230.

Figure 2G:
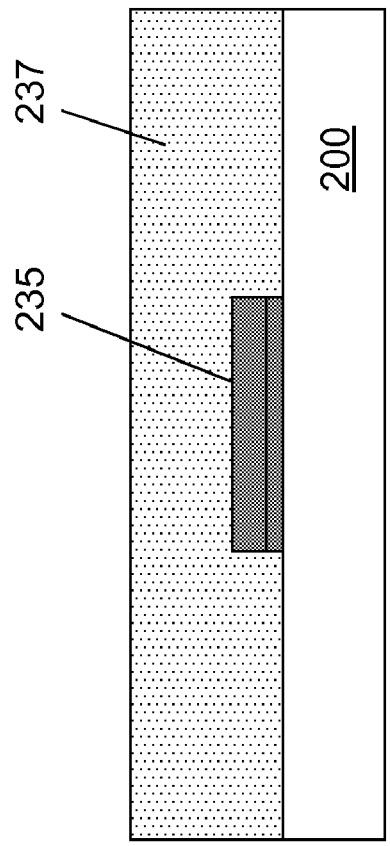

A photo-patternable layer 237 is next formed on the primary conductive structure 235 and the substrate 200 (step 160 and FIG. 2G). The photo-patternable layer 237 can be applied, such as by spin-coating or dip-coating a solution containing the photo-patternable onto the substrate. The photo-patternable layer 237 can also be applied by ejecting a solution containing the photo-patternable material. Fluid ejection can be achieved by using a fluid delivery head or aerosol can, or using electrophoresis deposition of the photo-patternable material. The photo-patternable layer 237 can also be formed by laminating a dry film resist onto the wafer. A negative photo resist can be used as the material in photo-patternable layers, which allows the exposed photo resist to remain and the unexposed photo resist above the opaque structure to be washed off in a developer solution. The exposed photo resist can thus form a mask to allow additional conductive layer to be formed on the opaque structure.

Figure 2H:
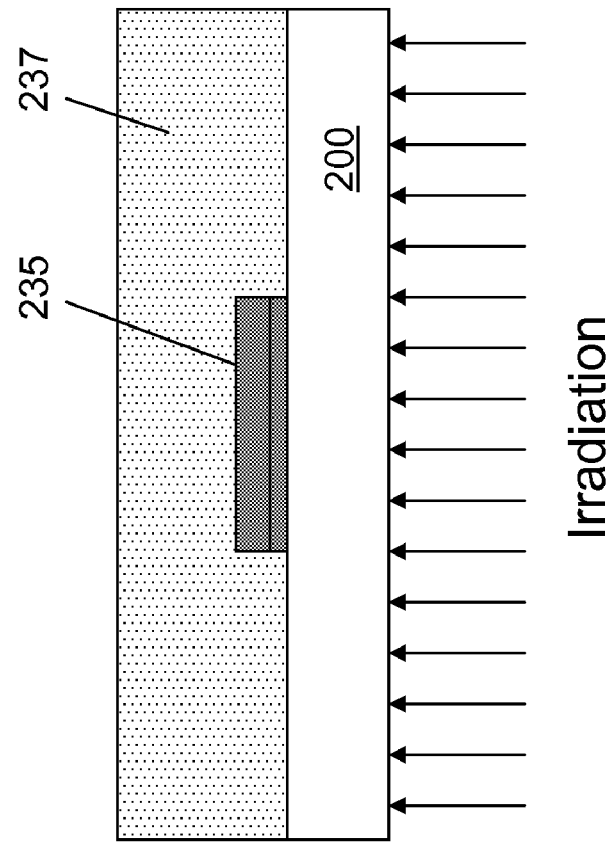

The photo-patternable layer 237 is then irradiated from the underside of the substrate 200 (step 170 and FIG. 2H). The irradiation can be conducted by, for example, UV light, visible light, x-ray or a combination thereof. The substrate 200 is made of a material that is transparent or semi-transparent to the radiation used in the exposure. For example, the substrate 200 is made of a material, such as an oxide, a plastic material, or diamond. The oxide material can include glass, silicon oxide, sapphire, or quartz. The conductive layer 230 is made of a material that is opaque to the irradiation. The seed electrode 210 can also provide opacity to the irradiation. For example, At least a portion of the conductive structure 235, such as the seed electrode 210 or the conductive layer 230, is made of copper, nickel, gold, tin, silver, palladium, platinum, rhodium, ruthenium, zinc, antimony, indium, or an alloy of at least one of these metallic materials at a thickness that is sufficient to block at least 50%, such as at least 60%, 70%, 80%, 90%, 95% or 100% of the irradiation. The portion of the photo-patternable layer 237 on the primary conductive structure 235 is blocked by the opaque primary conductive structure 235 and is thus not exposed to the radiation.

Figure 2I:
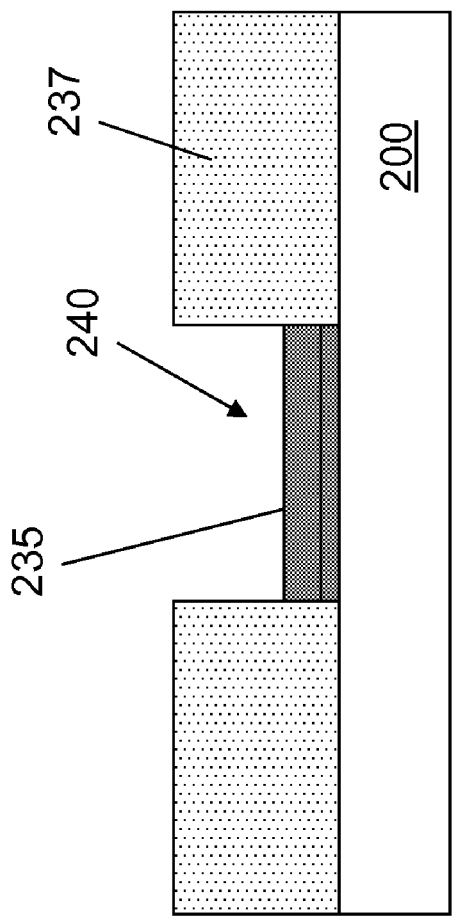

The photo-patternable layer 237 on the primary conductive structure 235 is next removed from above the primary conductive structure 235 (step 180 and FIG. 2I). The photo-patternable layer 237 can be removed by exposure to a developer solution that is capable of dissolving the unexposed portion of the photo-patternable layer 237 on the primary conductive structure 235. Removing the unexposed portion of the photo-patternable layer 237 produces an opening 240 in the photo-patternable layer 237 above the primary conductive structure 235.

Figure 2J:
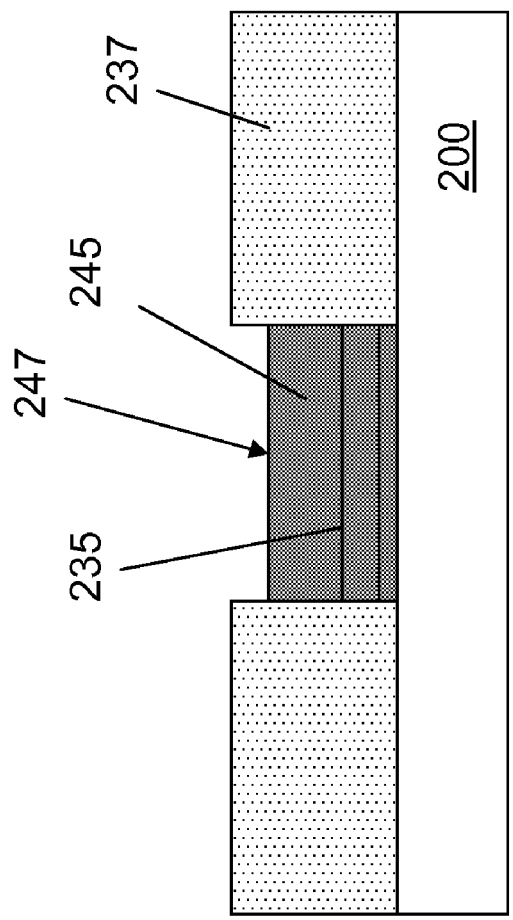

A conductive layer 245 is next formed on the primary conductive structure 235 (step 185 and FIG. 2J), for example, by electroplating. The photo-patternable layer 237 having the opening 240 serves as a mask for forming the conductive layer 245. The conductive layer 245 can have the same material composition as the seed electrode 210 and the conductive layer 230 such that a secondary unitary conductive structure 247 is formed by the seed electrode 210 and the conductive layers 230 and 245, or the primary conductive structure 235 and the conductive layer 245.

It is then determined whether it is desired to increase the height of the secondary conductive structure 247 (step 190). If no more structural portions will be built on the secondary conductive structure 247 to increase its height, the photo-patternable layer 235 is removed to leave a micro structure on the substrate (step 195). The resulting micro structure has a height defined by the combined thickness of the seed electrode 210 and the conductive layers 230 and 245. The photo-patternable material can be removed by a wet process or a dry process. For example, a photo-patternable material can be removed by a chemical stripper or strong oxidizing acid. A dry process can include plasma etching or UV/ozone etching.

Figure 2K:
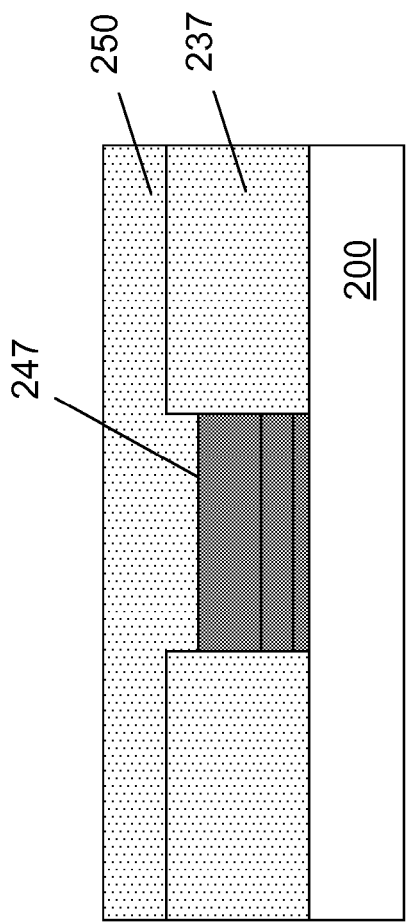
Figure 2L:
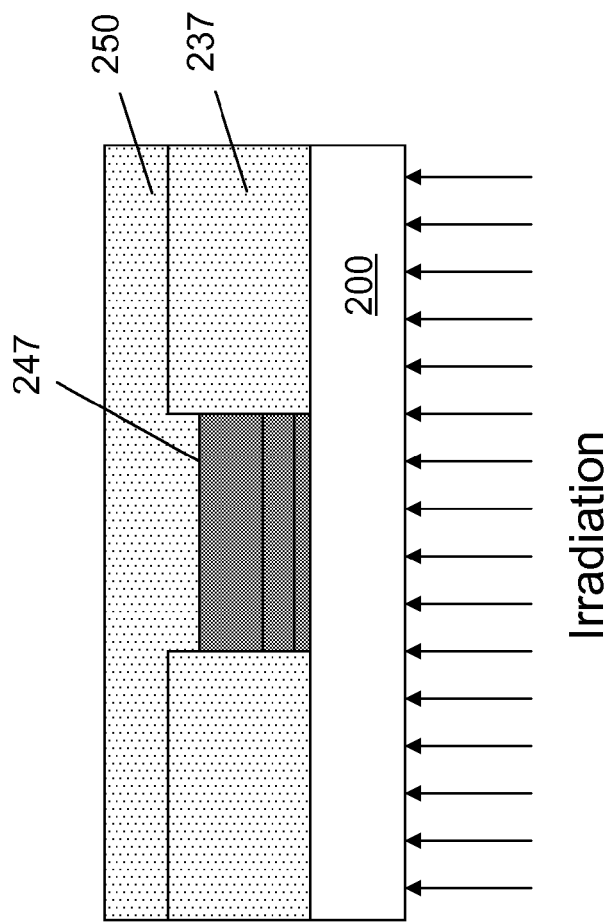
Figure 2M:
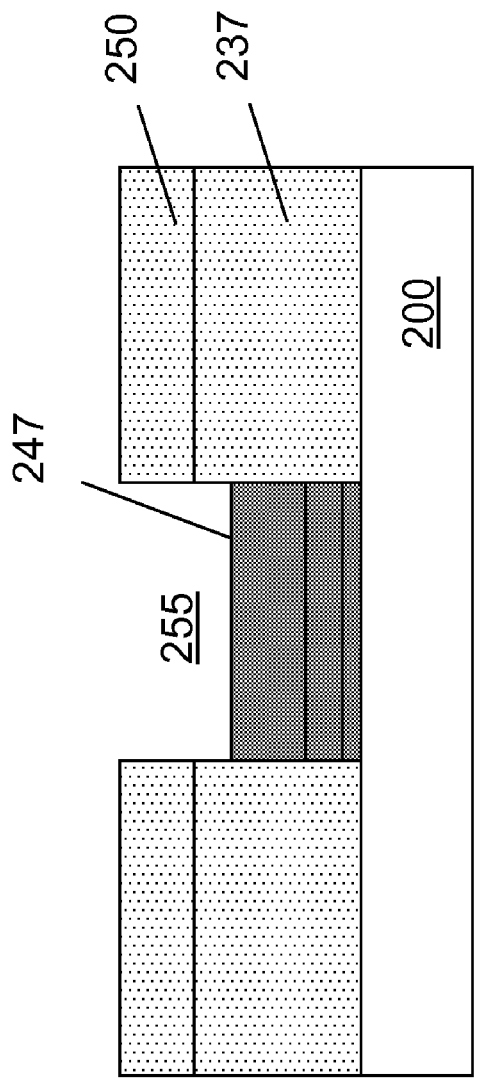
Figure 2N:
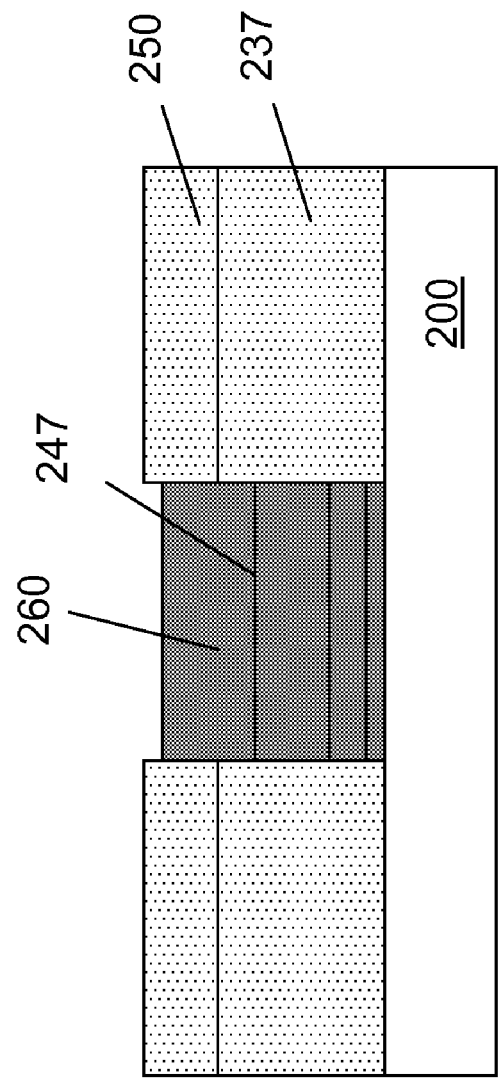

If the height of the secondary conductive structure is not sufficient, more structural portions can be built on the conductive layer 245. That is, steps 160 through 185 can be repeated. An additional photo-patternable layer 250 is formed on the photo-patternable layer 237 and the secondary conductive structure 247 (FIG. 2K). The additional photo-patternable layer 250 is then irradiated from the underside of the substrate 200 similar to step 170 (FIG. 2L). The irradiation can be, for example, exposure to UV, visible, x-ray light or a combination thereof. The photo-patternable layer 237 is at least semi-transparent to the irradiation to allow the irradiation to pass through and reach the photo-patternable layer 250. The photo-patternable layer 250 on the secondary conductive structure 247 is blocked by the opaque secondary conductive structure 247. The unexposed portion of the photo-patternable layer 250 on the conductive layer 245 is then removed by a developer solution to produce an opening 255. Referring to FIG. 2N, a conductive layer 260 is then formed on the conductive layer 245 using a similar process as the formation of the conductive layers 230 or 245. Steps 160 through 185 can be repeated to build more conductive layers over the conductive layer 260.

The photo-patternable layers 237, 250 can be removed to form a micro structure 270. The photo-patternable layers 237, 250 can be removed by a wet or a dry process as described above. The micro structure 270 includes a stack of the seed electrode 210 and multiple layers of conductive material. In some embodiments, the seed electrode 210 and the conductive layers 230, 245, 260 can include different conductive materials. In some embodiments, the micro structure 270 is a unitary structure formed by a seed electrode 210 and conductive layers 230, 245, 260 that are made of identical material compositions.

Embodiments of the systems and methods disclosed herein include one or more of a number of advantages. These disclosed system and methods can overcome the height and aspect ratio limitations of the micro structures formed by some conventional fabrication processes. The disclosure provides systems and methods for building a micro structure as high as 0.1 mm, 0.5 mm, 1 mm, or even higher, and with well defined lateral dimensions and wall angles, thus overcoming limitations associated with conventional micro fabrication techniques. The disclosed systems and methods can also achieve a height-to-width ratio between 1:1 and 100:1. The thickness limit for some conventional processes based on photo resist masking is approximately 100 microns. It can be difficult for conventional processes to achieve high height-to-width ratio between 1:1 and 100:1.

The disclosed systems and methods can also avoid creating variations in the micro structure's lateral dimensions by forming the micro structures in multiple steps. Some fabrication methods use photo resist to define the side walls of the micro structures. Electroplating baths used to form some micro structures are acidic and can attack the photo resist. Eroding the photo resist can widen the opening in the photo resist during electroplating, that is, the width of the top of the micro structure may be greater than the width of the bottom of the micro structure. Variation in the lateral dimensions of the micro structure can increase as the electroplating thickness increases. The lateral dimensions of the micro structure can be controlled, that is, over the height of the feature, the width of the feature changes less than 20%, such as 10%, 5% or 2%. This disclosure provides simple and efficient approaches for building a micro structure. An opaque structure built on a substrate can be used as a photo mask to define the lateral dimensions of the additional upper structure to be formed on the opaque structure. The use of the lower portion of the opaque structure to define the upper portion of the structure allows the lateral dimensions of the micro structure to be maintained within a desired tolerance along the height dimension of the micro structure. The use of the opaque structure as a photo mask can eliminate the need for forming a photo mask on the substrate.

The height of the micro structure in the disclosed methods can be easily increased by repeating the steps of photo mask patterning and electroplating additional conductive layers on the already formed micro structure. The structure growth in each step can be selected to be lower than a thickness limitation such that the lateral dimensions of the structure are kept within tolerance through the repeated steps. Furthermore, the disclosed methods are suitable for fabricating a micro structure on a transparent or semi-transparent substrate.

As each layer of the micro structure is formed, there can be some amount of difference in the lateral dimensions of each layer, as shown in FIGS. 4-7. Because the micro structure is formed using an iterative process, the structure can appear to have bands or striations that appear somewhat like a stack of sheets of paper. The walls may appear scalloped or cause the cross section of the micro structure to have a slightly trapezoidal shape or hour-glass shape. That is, the walls may not be flat in a vertical direction between the layer that is closest to the substrate and the layer that is furthest from the substrate. The walls tend to be symmetrical with respect to a vertical axis that is perpendicular to the surface of the substrate.

Figure 3A:
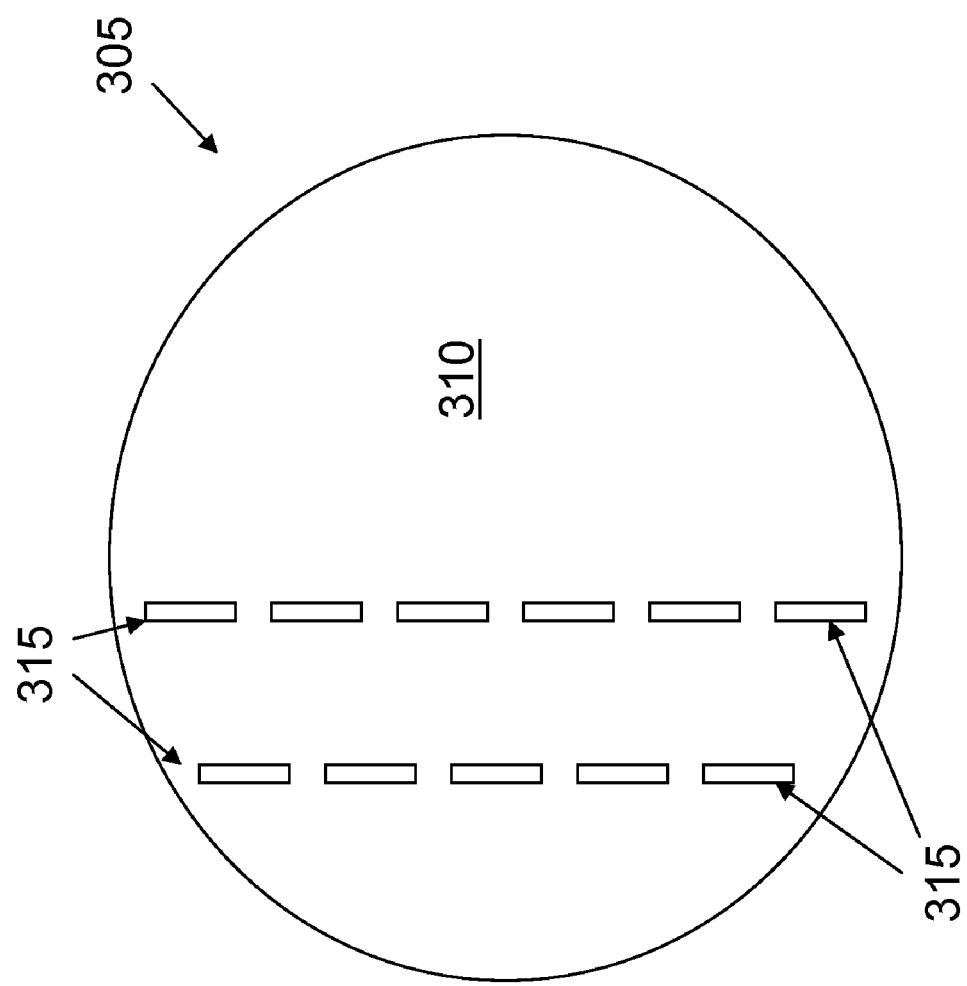
FIG. 3A is a plan view of an encapsulation device.
Figure 3B:
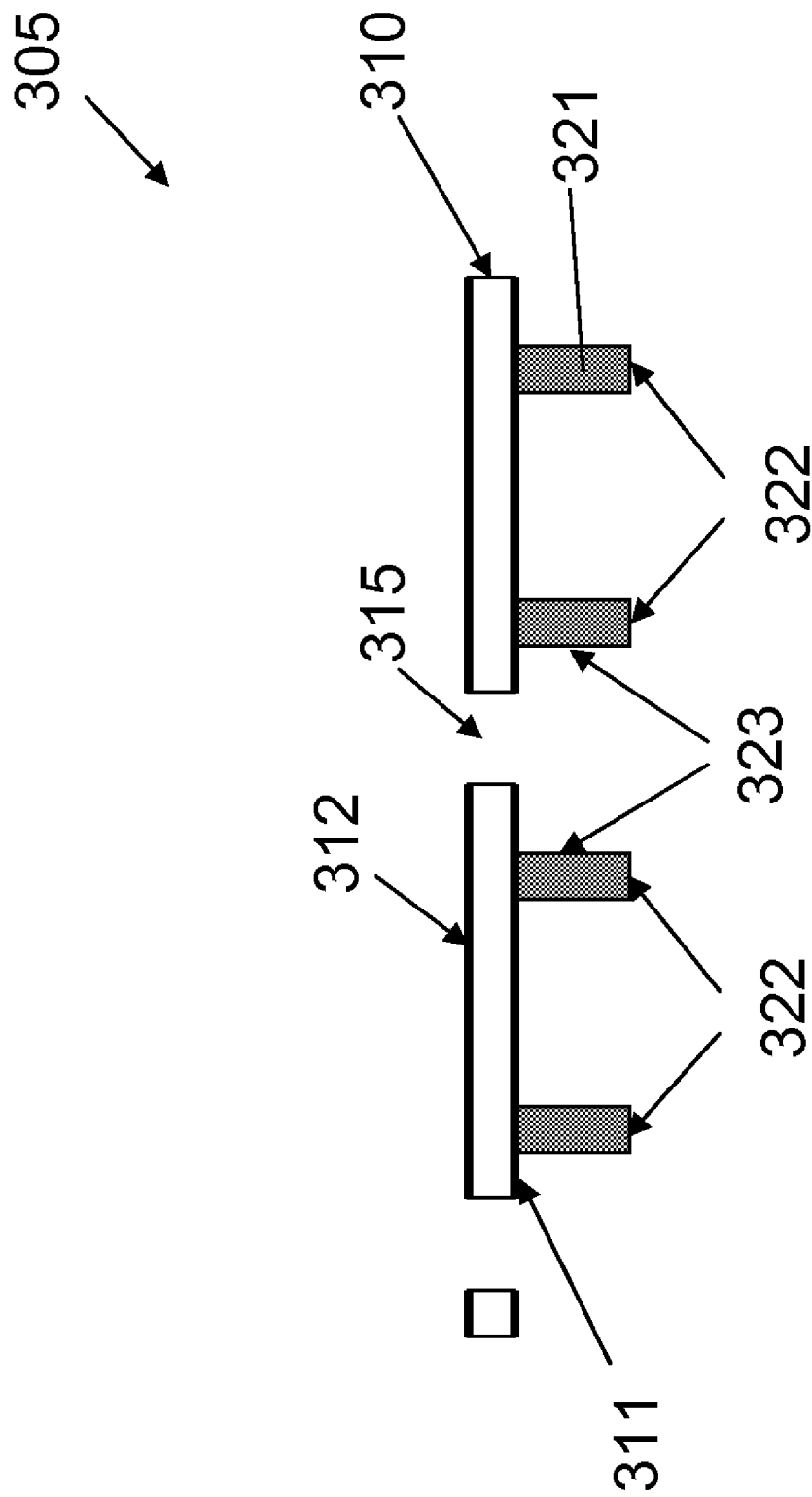
FIG. 3B is a cross-sectional view of the encapsulation device of FIG. 3A along A-A.

The micro structure fabricated using the above described process can be used in the packaging of micro devices on a substrate. Referring to FIGS. 3A and 3B, an encapsulation device 305 can include an encapsulation cover 310 and a plurality of spacer walls 321 in connection with the encapsulation cover 310. One or more antireflective layers 312 and 311 can be coated on the surfaces of the encapsulation cover 310. The spacer walls 321 can include base faces 322 and side faces 323.

Figure 2O:
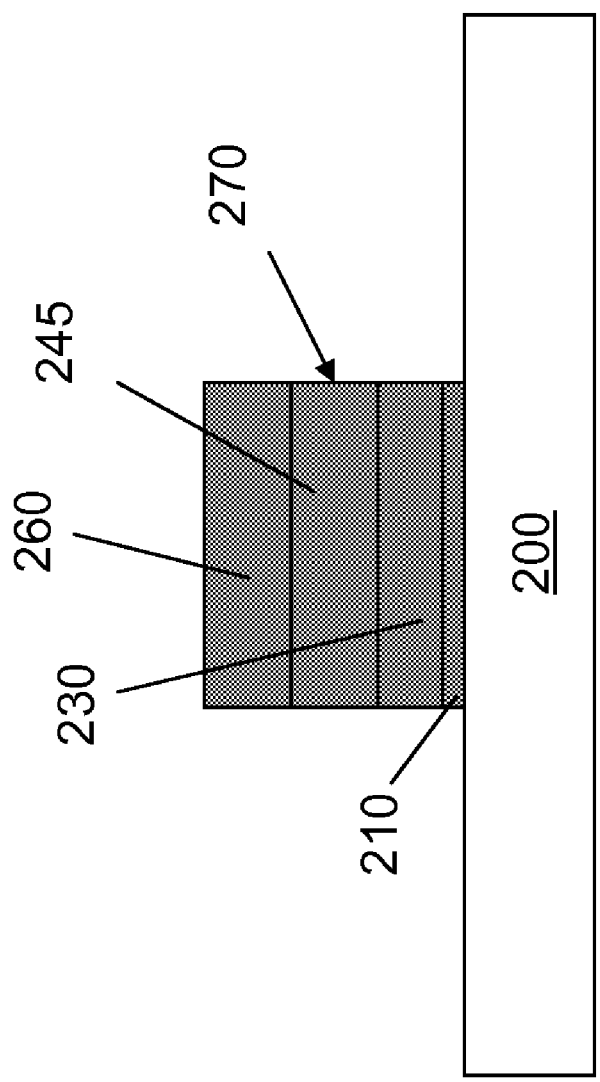

The spacer walls 321 can be formed using the process described in FIGS. 1-2O on the encapsulation cover 310. The spacer walls 321 can include a seed electrode and conductive layers. The spacer walls 321 can be made of conductive materials such as metallic materials as described above. The encapsulation cover 310 is made of a transparent material, such as glass or silicon dioxide, which allows photo irradiation through the encapsulation cover 310 to the photo-patternable materials on the surface on which the spacer walls 321 are to be formed. An encapsulation cover 310 transparent to visible light can allow visual examinations of the micro devices 390 and optical communications with micro devices 390 after the encapsulation of the micro device 390 (FIG. 3C).

Figure 3C:
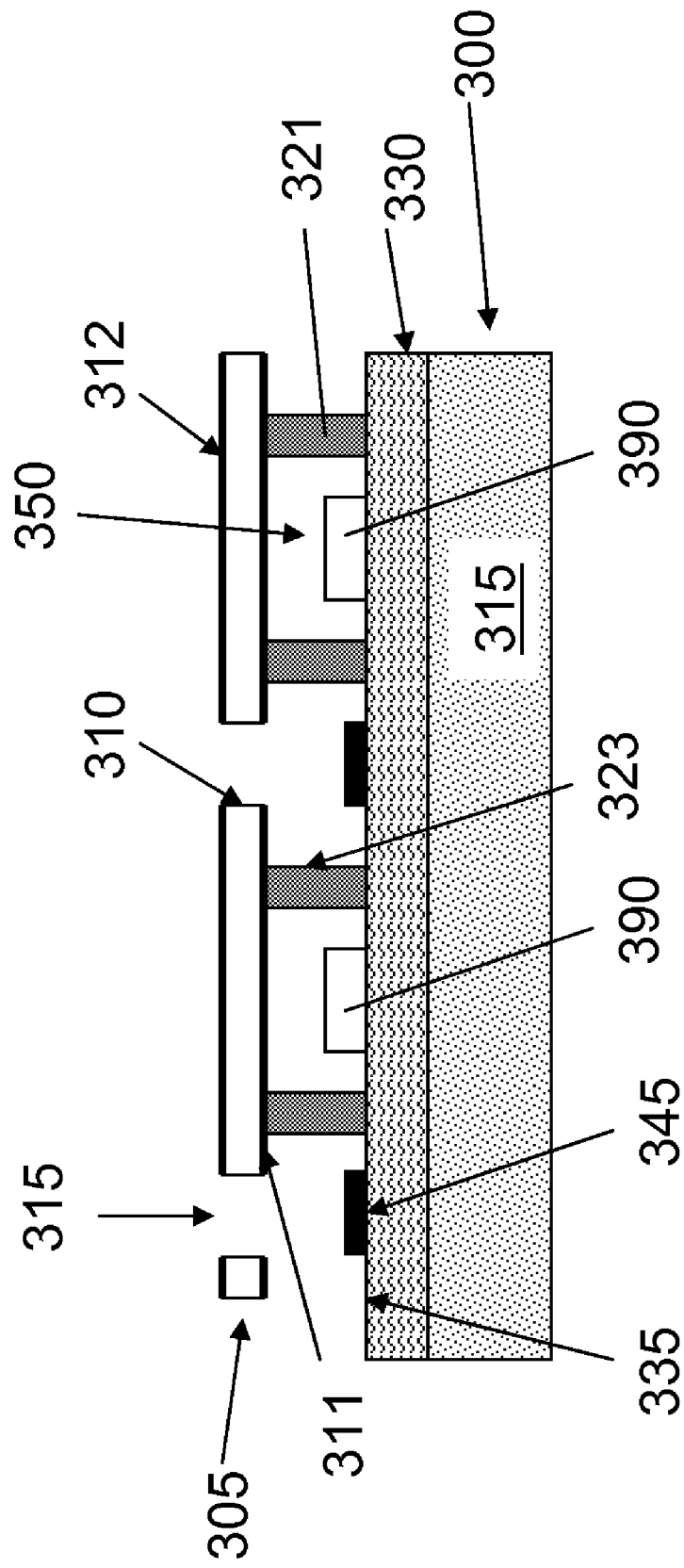
FIG. 3C is a cross-sectional view of a substrate having micro devices encapsulated by the encapsulation device of FIG. 3A.
Figure 5:
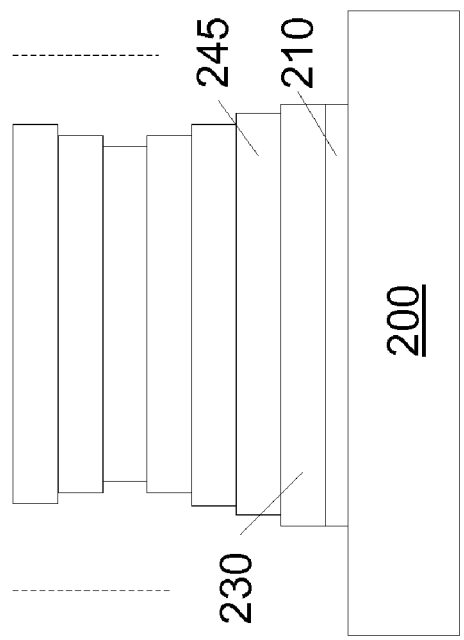
FIGS. 4-7 are schematic side views of micro structures.
Figure 4:
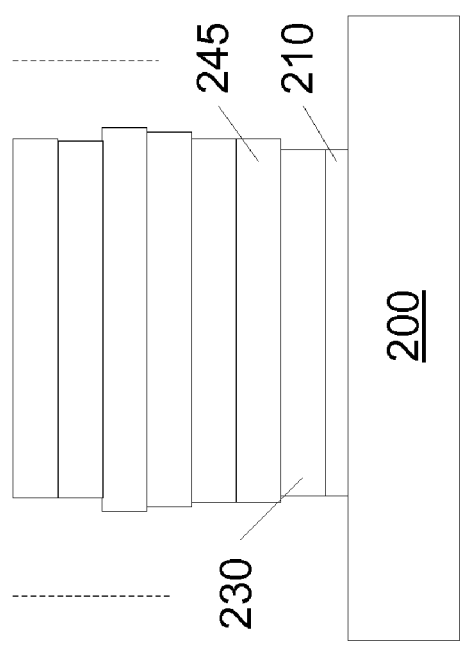
Figure 7:
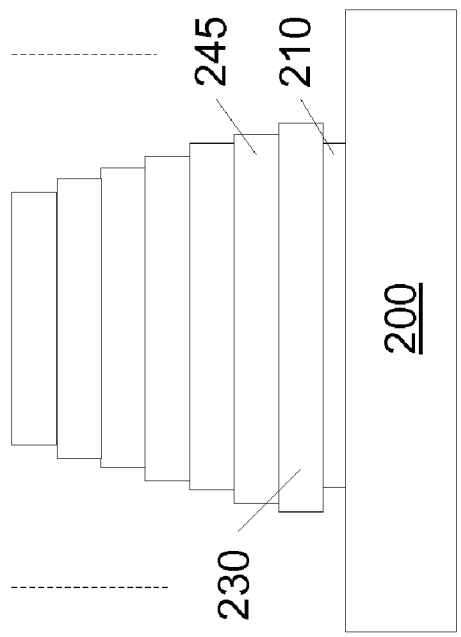
Figure 6:
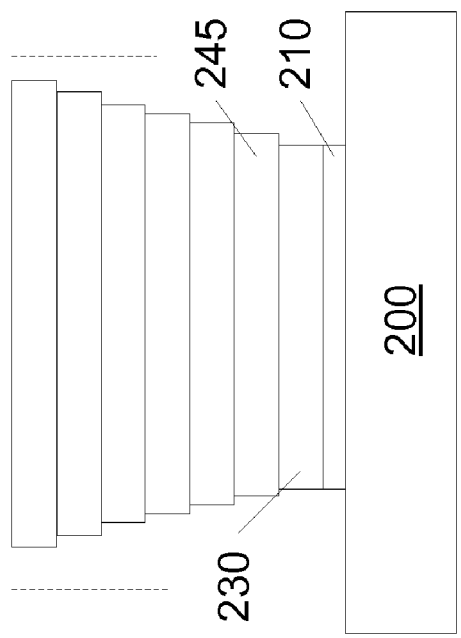

Referring to FIG. 3C, one or more micro devices 390 can be formed on a semiconductor wafer 300. An example of a micro device 390 is a spatial light modulation device that includes one or more tiltable micro mirrors. The semiconductor wafer 300 can include a substrate 315 and a circuit layer 330. The semiconductor wafer 300 can also include a plurality of electric terminals 345 for receiving input signals for the micro devices 390 or output signals from the micro devices 390. The encapsulation cover 310 can include a plurality of openings 315 that allow access to the electric terminals 345 from outside. The circuit layer 330 includes electronic circuits that can process input signals received at electric terminals 345 and send the signals to the micro devices 390. One or more components in the micro device 390 can move under the control of the input signals. Output signals from the micro devices 390 can also be transmitted to the electric terminals 345 via an electric circuit in the circuit layer 330. The electrical contacts between the micro devices 390 and the electrical terminals 345 are provided through electric circuit layer 330. The electrical terminals 345 are positioned to the side of opening 315 in order to allow dicing and/or cleaving of substrate 300 without damage to the electric circuitry 330 or the electrical terminals 345. The micro devices on the semiconductor wafer 300 can be tested electronically before the semiconductor wafer 300 is diced into dies.

To encapsulate the micro device 390 using the encapsulation device 305, adhesive material such as an epoxy can be applied to the base face 322 of the spacer walls 321 or to the surface areas surrounding each micro device 390 to form a seal all around the micro device 390 on the substrate 315. The application of the adhesive material can be conducted in vacuum or in environment with pressure lower than ambient pressure. The encapsulation device 305 is then held to the substrate with the adhesive therebetween so that the base face 322 of the spacer walls 321 come to contact and seal to the upper surface 335 of the substrate 315. If necessary, the encapsulation device 305 and the substrate 315 are pressed together. The adhesive can be then cured, such as by heat or UV irradiation to form a seal the micro device under the encapsulation device. A chamber 350 formed by the spacer walls 321 and the encapsulation cover 310 encloses a micro device 390. The spacer walls 321 form a close loop around the micro device on the substrate. The sealing can be hermetic or semi-hermetic. After sealing, the interior of the chamber 350 can be maintained in a vacuum, partial vacuum, a high-pressure or ambient pressure environment.

Since both metal and silicon wafer are not transparent to UV light, the following techniques can help bond a metal-based spacer wall to a silicon-based semiconductor wafer 300. A UV-curable epoxy is disposed on the base face 322 of the spacer walls 321 or the surface of the semiconductor wafer 300, such as by dispensing, screen printing, stenciling, stamping, or applying as an adhesive transfer film. The amount of the UV curable epoxy is controlled to create an excess such that a slight overflow is outside both edges of the interface at the base face 322 of the spacer walls 321 or the surface of the semiconductor wafer 300 after the encapsulation cover 310 is held to the surface of the semiconductor wafer 300. Non-collimated UV light can be used to cure the overflow epoxy to seal the edges around the interface between the spacer walls 321 and the semiconductor wafer 300. The epoxy can then be subjected to heat for further thermal curing of the portion of the epoxy that has been only partially exposed or not exposed to UV light. The amount of epoxy overflow sideways should be minimized. First, sideway overflow increases the area of the chip as the active area of the display has to be moved further away from the sealing ring. Second, sideway overflow can create larger epoxy surface area and consequently larger out-gassing that is detrimental to some micro devices. Third, sideway overflow to the outside is also not desirable because electrical pads have to be shifted further away from active area, again increasing the pitch of devices.

It should be noted that in some cases the same material can be used in the seed electrode layer and the conductive layer(s) on the seed electrode layer. The seed electrode layer and the upper conductive layers can be differentiated within the combined micro structure. When the seed electrode layer and the upper conductive layers are fabricated, the different layers can include discernable sideways displacements due to slight misalignment in the lithographic process. These sideways displacements can be detected as indicating the step-wise formation of different layers. Furthermore, the seed electrode layer is typically deposited with a vacuum process with well-controlled material compositions. The upper conductive layers are electroplated and can often include much higher levels of contaminants. Material composition analysis can distinguish the formation of the seed electrode layer and the conductive layers, even when the main material composition is the same for both the seed electrode and conductive layers. Structural features such as grain size and mechanical properties such as hardness may also distinguish the various layers.

In some embodiments, the seed layer is a multilayer structure. The first layer can be an adhesive layer, such as titanium, titanium nitride, ruthenium, rhodium, platinum or titanium tungsten. A second or subsequent layer can form the conductive layer, which serves as the cathode during electroplating. In some embodiments, the conductive layers can be substantially free of silicon.

It is understood that the disclosed systems and methods are compatible with different techniques and materials in addition to the ones described above. For example, the photo-patternable layers can include photo resist materials and photo-patternable epoxy that may include SU-8, from Micro-Chem Corp. Newton, Mass. Materials suitable for the substrate are not limited to the above described examples. In general, the substrate can include materials that are transparent or semi-transparent to a selected irradiation. The materials for the conductive layers are also not limited to the examples described above. Furthermore, the terms such as "up", "under", "upper side" and "underside" are used to describe the relative alignment or positions of the substrate and structures built on the substrate. The disclosed systems and methods are compatible with substrate aligned in other orientations relative to the gravity direction.

What is claimed is:

1. A micro structure, comprising:
a seed electrode layer on a substrate; and
one or more conductive layers on the seed electrode layer, wherein the combined thickness of the seed electrode layer and the one or more conductive layers is more than 0.1 mm, the lateral dimensions of the seed electrode layer and the one or more conductive layers vary less than 20% along the direction normal to a surface of the substrate and the micro structure has striations on an outer surface;
wherein the micro structure has a height extending along an axis perpendicular to a main surface of the substrate and a height-to-width ratio between 1:1 and 100:1.

2. The micro structure of claim 1, wherein the seed electrode layer comprises a metallic material.

3. The micro structure of claim 1, wherein the one or more conductive layers comprise a metallic material.

4. The micro structure of claim 3, wherein the metallic material comprises copper, nickel, gold, tin, silver, palladium, platinum, rhodium, indium, ruthenium, antimony, zinc, tantalum, chromium, a combination thereof or an alloy thereof.

5. The micro structure of claim 1, wherein the one or more conductive layers have substantially the same composition.

6. The micro structure of claim 1, wherein the substrate is at least partially transparent to photons and the first layer of conductive material is substantially opaque to the photons.

7. The micro structure of claim 1, wherein the substrate comprises an oxide, a plastic material, or diamond.

8. The micro structure of claim 7, wherein the oxide comprises glass, silicon oxide, sapphire, or quartz.

9. The micro structure of claim 1, wherein the lateral dimensions of the seed electrode layer and the one or more conductive layers vary less than 10% along the direction normal to a surface of the substrate.

10. The micro structure of claim 1, wherein the combined thickness of the seed electrode layer and the one or more conductive layers is more than 0.5 mm.

11. A micromechanical system, comprising:
a substrate;
a micro device on a surface of the substrate; and
an encapsulation device bonded with the surface of the substrate to form a chamber in which the micro device is encapsulated, wherein the encapsulation device comprises a micro structure including a seed electrode layer on a substrate and one or more conductive layers on the seed electrode layer, the combined thickness of the seed electrode layer and the one or more conductive layers being more than 0.1 mm, the lateral dimensions of the seed electrode layer and the one or more conductive layers varying less than 20% along the direction normal to the surface of the substrate and the micro structure having striations on an outer surface.

12. The micro structure of claim 11, wherein the encapsulation device comprises an encapsulation cover that is at least partially transparent to photons, wherein the micro structure is connected with the encapsulation cover.

13. The micro structure of claim 12, wherein the first layer of conductive material is substantially opaque to the photons.

14. The micro structure of claim 12, wherein the micro structure forms a seal all around the micro device on the substrate.

15. The micro structure of claim 12, wherein the encapsulation cover comprises an oxide, a plastic material, or diamond.

16. The micro structure of claim 11, wherein the seed electrode layer comprises a metallic material.

17. The micro structure of claim 11, wherein the one or more conductive layers comprise a metallic material.

18. The micro structure of claim 17, wherein the metallic material comprises copper, nickel, gold, tin, silver, palladium, platinum, rhodium, indium, ruthenium, antimony, zinc, tantalum, chromium, a combination thereof or an alloy thereof.

19. The micro structure of claim 11, wherein the lateral dimensions of the seed electrode layer and the one or more conductive layers vary less than 10% along the direction normal to the surface of the substrate.

20. The micro structure of claim 11, wherein the combined thickness of the seed electrode layer and the one or more conductive layers is more than 0.5 mm.

* * * * *